United States Patent [19]

Sawada

[11] Patent Number: 5,365,481
[45] Date of Patent: Nov. 15, 1994

[54] SEMICONDUCTOR MEMORY DEVICE HAVING TEST MODE AND METHOD OF SETTING TEST MODE

[75] Inventor: Seiji Sawada, Hyogo, Japan

[73] Assignee: Mitsubishi Denki Kabushiki Kaisha, Tokyo, Japan

[21] Appl. No.: 88,641

[22] Filed: Jul. 9, 1993

[30] Foreign Application Priority Data

Jul. 14, 1992 [JP] Japan .................................. 4-186610

[51] Int. Cl.⁵ .............................................. G11C 7/00
[52] U.S. Cl. ............................. 365/201; 365/189.03; 365/194; 365/195
[58] Field of Search .................. 365/201, 189.03, 226, 365/227, 228, 195, 194

[56] References Cited

U.S. PATENT DOCUMENTS

| | | | |
|---|---|---|---|
| 5,134,586 | 7/1992 | Steele | 365/201 |
| 5,134,587 | 7/1992 | Steele | 365/201 |
| 5,204,837 | 4/1993 | Suwa et al. | 365/201 |
| 5,270,977 | 12/1993 | Iwamoto et al. | 365/201 |

FOREIGN PATENT DOCUMENTS 63-98213  4/1988  Japan .
2-29118   1/1990  Japan .
4-98700   3/1992  Japan .

Primary Examiner—Eugene R. LaRoche
Assistant Examiner—Christopher R. Glembocki
Attorney, Agent, or Firm—Lowe, Price, LeBlanc & Becker

[57] ABSTRACT

A semiconductor memory device according to the present invention includes a memory cell array, internal circuits for reading and writing of data of the memory cell array, a test mode controller, and power-on-reset circuits. The test mode controller sets a test mode of the memory cell array in response to a predetermined pattern of change of logic levels of at least several control signals out of a plurality of control signals for controlling the internal circuits. The power-on-reset circuits set the test mode controller in an initial state over a variable period which is defined based on a timing of change of a logic level of a control signal determining a timing of setting of the test mode out of the at least several control signals, in response to power-on. As a result, it is possible to prevent the semiconductor memory device from erroneously entering the test mode caused by a noise or the like after power-on.

7 Claims, 11 Drawing Sheets

SEMICONDUCTOR MEMORY DEVICE HAVING TEST MODE AND METHOD OF SETTING TEST MODE

BACKGROUND OF THE INVENTION

1. Field of the Invention

The present invention generally relates to semiconductor memory devices and a method of setting a test mode, and more particularly, to a semiconductor memory device having a test mode which is set based on an external control signal and a method of setting the test mode.

2. Description of the Background Art

With a semiconductor memory device made large in memory capacity in recent years, a function test of a memory cell array in the semiconductor memory device after manufacture has become more important. However, a time required for such a function test becomes longer as the number of memory cells included in the memory cell array increases, that is, the memory capacity of the semiconductor memory device increases. Therefore, increase of a time required for such a function test in the semiconductor memory device with large memory capacity has become a problem in recent years.

In order to shorten a time required for such a function test, a so-called on-chip test circuit system is employed recently in many cases in which a circuit unit for such a function test (hereinafter referred to as a "test circuit") is provided on the same chip together with circuits constituting a semiconductor memory device. For example, such an on-chip test circuit system is used in a DRAM (Dynamic Random Access Memory) in many cases.

FIG. 7 is a block diagram showing the entire configuration of a DRAM in which the on-chip test circuit system is employed. Referring to FIG. 7, a memory cell array 1 includes memory cells (not shown) arranged in rows and columns in a matrix manner, word lines (not shown) provided one for each row, and bit line pairs (not shown) provided one pair for each column. Each of the memory cells is connected to a word line of a corresponding row and a bit line pair of a corresponding column.

Selection of any word line is carried out by a row decoder 2, and selection of any bit line pair is carried out by a column decoder 3. Word line selection by row decoder 2 and bit line pair selection by column decoder 3 are carried out in response to a row address signal RA0 to RA9 and a column address signal CA0 to CA9 provided from an address buffer 4, respectively.

Address buffer 4 incorporate either an internal address signal Q0 to Q9 provided from a refresh counter 8 or an external address signal A0 to A10, based on an internal row address strobe signal intRAS provided from a RAS input circuit 10 and an internal column address strobe signal intCAS provided from a CAS input circuit 12.

Furthermore, address buffer 4 provides the row address signal RA0 to RA10 and the column address signal. CA0 to CA10 corresponding to the incorporated address signal. In the normal data reading operation and the normal data writing operation, address buffer 4 incorporates the external address signal A0 to A10. In the refresh operation in which data is rewritten in the memory cells before memory data of the memory cells in memory cell array 1 disappears, address buffer 4 incorporates the internal address signal Q0 to Q9 from refresh counter 8.

A refresh controller 9 instructs output of the internal address signal to refresh counter 8 at a predetermined timing, based on the internal row address strobe signal intRAS from RAS input circuit 10. Refresh counter 8 generates the internal address signal Q0 to Q9 indicating the address of the memory cell having memory data to be refreshed, in response to instruction from refresh controller 9.

Row decoder 2 carries out word line selection based on the row address signal RA0 to RA9 from address buffer 4 at a timing based on the internal row address strobe signal intRAS from RAS input circuit 10. On the other hand, column decoder 3 carries out bit line pair selection based on the column address signal CA0 to CA9 from address buffer 4 at a timing based on the internal column address strobe signal intCAS from CAS input circuit 12.

More specifically, column decoder 3 controls an I/0 gate 5 in order to electrically connect only a bit line pair corresponding to the column address signal CA0 to CA10 out of bit line pairs in memory cell array 1 to an input buffer 6 or an output buffer 7 at a timing corresponding to the internal column address strobe signal intCAS.

I/O gate 5 includes transfer gates (not shown) provided corresponding to respective bit line pairs in order to connect bit line pairs in memory cell array 1 to input buffer 6 and output buffer 7. Column decoder 3 carries out bit line pair selection by bringing into an on state only a transfer gate corresponding to a bit line pair of a column address indicated by the column address signal CA0 to CA9 out of the transfer gates included in I/O gate 5.

A sense amplifier 15 amplifies data (read out data) which appears in each of the bit line pairs in memory cell array 1 in the data reading operation. By bit line pair selection operation of column decoder 3, only a bit line pair corresponding to the address signal out of the bit line pairs in memory cell array 1 is connected to output buffer 7 through I/O gate 5. Therefore, only read out data which appears in the corresponding bit line pair out of the bit line pairs in memory cell array 1 is applied to a data output terminal $D_{out}$ through output buffer 7 after being amplified by sense amplifier 15.

In the data writing operation, data applied to a data input terminal $D_{in}$ is applied to I/O gate 5 through input buffer 6. As a result, externally applied data is written in a selected memory cell through a bit line pair selected by column decoder 3 out of the bit line pairs in memory cell array 1.

Reception and transmission of data among I/O gate 5, input buffer 6 and output buffer 7 are carried out on the 8-bit basis in maximum. However, in the normal data writing operation and the normal data reading operation, an I/O controller 11 controls input buffer 6 and output buffer 7 so that reception and transmission of data among I/O gate 5, input buffer 6 and output buffer 7 are carried out on the 4-bit basis.

I/O controller 11 controls input buffer 6 and output buffer 7, based on the least significant bits RA10 and CA10 in the row address signal RA0 to RA0 and the column address signal CA0 to CA10, respectively, provided from address buffer 4 and the internal write enable signal intWE provided from WE input circuit 13.

More specifically, in the data reading operation in which the internal write enable signal $\overline{\text{intWE}}$ is at a logic high or "H" level, I/O controller 11 controls operation of output buffer 7 based on the row address signal bit RA10 and the column address signal bit CA10 so that output buffer 7 provides only 1-bit data corresponding to the address designated by the row address signal bit RA0 and the column address signal bit CA10 out of 4-bit data incorporated from I/O gate 5.

Similarly, in the data writing operation in which the internal write enable signal $\overline{\text{intWE}}$ is at a logic low or "L" level, I/O controller 11 controls operation of input buffer 6 based on the row address signal bit RA10 and the column address signal bit CA10 so that input buffer 6 incorporates data applied from the data input terminal $D_{in}$ to apply the same to a transfer gate corresponding to a bit line pair of the address designated by the row address signal bit RA10 and the column address signal bit CA10 out of the transfer gates in I/O gate 5.

In the refresh operation, data read out to output buffer 7 is again applied to I/O gate 5 as writing data. Since address buffer 4 incorporates the internal address signal Q0 to Q9 from refresh counter 8 in the refresh operation, memory data of the memory cell of the address instructed by the internal address signal Q0 to Q9 is refreshed.

In a test mode in which a function test of memory cells in memory cell array 1 is carried out, reception and transmission of data among I/O gate 5, input buffer 6 and output buffer 7 are carried out on the 8-bit basis. More specifically, in the test mode, column decoder 3, input buffer 6 and output buffer 7 operate in response to a test enable signal $\overline{\text{TE}}$ of an "L" level from a test mode controller 14.

When described more specifically, column decoder 3 ignores the least significant bit CA10 of the column address signal, and decodes only the higher bits CA0 to CA9 of the column address signal to carry out bit line selection, during a period when it receives the test enable signal $\overline{\text{TE}}$ of an "L" level from test mode controller 14. As a result, the number of bit line pairs selected by column decoder 3 at one time is made double of that in the normal data reading operation and the normal data writing operation.

On the other hand, during a period when input buffer 6 receives the test enable signal $\overline{\text{TE}}$ of an "L" level from test mode controller 14, it is controlled by I/O controller 11 to apply 8-bit data provided at the data input terminal $D_{in}$ to I/O gate 5 in parallel.

Similarly, during a period when output buffer 7 receives the test enable signal $\overline{\text{TE}}$ of an "L" level from test mode controller 14, output buffer 7, controlled by I/O controller 11, detects match and mismatch of the 8-bit data applied from I/O gate 5 in parallel with written data to provide the result to the data output terminal $D_{out}$.

Therefore, the result of determination of whether or not all the data read out to eight pairs of bit line pairs selected by column decoder 3 in the test mode matches the written data is provided outside through output buffer 7. The externally applied 8-bit writing data is applied to the eight pairs of bit line pairs in parallel through input buffer 6.

A function test of a memory cell array is carried out by, after writing a predetermined data in all or a part of the memory cells included in the memory cell array, reading out data from the memory cell in which the data is written, to determine whether or not the read out data matches the data written in advance. Therefore, by the above-described operation of column decoder 3, input buffer 6 and output buffer 7 in the test mode, tests for eight memory cells are automatically carried out simultaneously. More specifically, in the test mode, the memory cells in memory cell array 1 are tested automatically for every eight memory cells. It should be noted that a pattern and the like of the data written in the memory cell array for testing depend on the kind of the test.

Test mode controller 14 is a circuit for setting the DRAM in the test mode based on the internal row address strobe signal $\overline{\text{intRAS}}$ from $\overline{\text{RAS}}$ input circuit 10, the internal column address strobe signal $\overline{\text{intCAS}}$ from $\overline{\text{CAS}}$ input circuit 12, and the internal write enable signal $\overline{\text{intWE}}$ from $\overline{\text{WE}}$ input circuit 13.

$\overline{\text{RAS}}$ input circuit 10, $\overline{\text{CAS}}$ input circuit 12, and $\overline{\text{WE}}$ input circuit 13 buffer the external row address strobe signal $\overline{\text{RAS}}$, the external column address strobe signal $\overline{\text{CAS}}$, and the external write enable signal $\overline{\text{WE}}$ which are external control signals, to provide the buffered signals as the internal row address strobe signal $\overline{\text{intRAS}}$, the internal column address strobe signal $\overline{\text{intCAS}}$, and the internal write enable signal $\overline{\text{intWE}}$, respectively. Therefore, the internal control signals $\overline{\text{intRAS}}$, $\overline{\text{intCAS}}$, and $\overline{\text{intWE}}$ have waveforms substantially the same as those of the external control signals $\overline{\text{RAS}}$, $\overline{\text{CAS}}$, and $\overline{\text{WE}}$, respectively.

Description will now be given on specific operation of test mode controller 14 with reference to FIG. 8. FIG. 8 is a waveform diagram showing waveforms of the external row address strobe signal $\overline{\text{RAS}}$ (a), the internal row address strobe signal $\overline{\text{intRAS}}$ (b), the external column address strobe signal $\overline{\text{CAS}}$ (c), the internal column address strobe signal $\overline{\text{intCAS}}$ (d), the external write enable signal $\overline{\text{WE}}$ (e), the internal write enable signal $\overline{\text{intWE}}$ (f) and the test enable signal $\overline{\text{TE}}$ (g), when test mode controller 14 sets the DRAM in the test mode.

Referring to FIG. 8, test mode controller 14 is activated when the internal signals $\overline{\text{intCAS}}$ (FIG. 8 (d)) and $\overline{\text{intWE}}$ (FIG. 8 (f)) both are already at an "L" level at a time t1 of the fall of the internal signal $\overline{\text{intRAS}}$ (FIG. 8 (b)). Activated test mode controller 14 causes the test enable signal $\overline{\text{TE}}$ (FIG. 8 (g)) to fall to an "L" level. As a result, column decoder 3, input buffer 6 and output buffer 7 in FIG. 5 carry out operation for a test as described above.

Since test mode controller 14 operates as described above, a user may set timings of respective signals so as to cause the external control signal $\overline{\text{RAS}}$ to fall to an "L" level during a period when the external control signals $\overline{\text{CAS}}$ and $\overline{\text{WE}}$ both are at an "L" level, in order to set the DRAM in the test mode. A method of setting a test mode is determined internationally by Joint Electron Device Engineering Council (JEDEC).

Referring again to FIG. 7, a power-on-reset circuit 16 receives a voltage $V_{CC}$ supplied from an external power source (not shown). Power-on-reset circuit 16 applies a one-shot pulse of an "H" level to predetermined circuit units in the DRAM in response to the rise of the power supply voltage $V_{CC}$, that is, power-on to the DRAM. The one-shot pulse is called a power-on-reset signal POR.

Potentials of predetermined nodes in the predetermined circuit units are forced to respective levels to be taken in the initial state by the power-on-reset signal POR. As a result, the predetermined circuit units are brought into reset states at the initiation of operation. The power-on-reset signal POR is applied to, for example, $\overline{RAS}$ input circuit 10 as well as test mode controller 14. As described above, a semiconductor memory device generating a reset signal at the time of power-on is disclosed in, for example, Japanese Patent Laying-Open No. 2-29118 and Japanese Patent Laying-Open No. 63-98213.

Although it is shown in FIG. 7 that the output POR of power-on-reset circuit 16 is applied only to $\overline{RAS}$ input circuit 10 and test mode controller 14, the output POR is actually applied to the other circuit units as necessary.

In response to the applied power-on-reset signal POR, test mode controller 14 forcibly maintains the test enable signal $\overline{TE}$ at an "H" level during a period when the power-on-reset signal POR is at an "H" level, and retains the reset state so that the DRAM will not enter the test mode.

FIGS. 9 and 10 are waveform diagrams showing reset operation of the test mode controller by the above-described power-on-reset signal POR. FIG. 9 shows operation in the state where the external row address strobe signal $\overline{RAS}$ (c), the external column address strobe signal $\overline{CAS}$ (e), and the external write enable signal $\overline{WE}$ (g) all are already at an "H" level at the time of power-on (time $t_2$) to the DRAM.

In the case of FIG. 9, as the power supply voltage $V_{CC}$ (a) rises after power-on at the time $t_2$, the power-on-reset signal POR (b), the internal row address strobe signal int$\overline{RAS}$ (d), the internal column address strobe signal int$\overline{CAS}$ (f), the internal write enable signal int$\overline{WE}$ (h) and the test enable signal $\overline{TE}$ (i) rise to an "H" level simultaneously to reach the respective initial states. As described above, the power-on-reset signal POR maintains an "H" level during a predetermined reset period since its rise, and falls to an "L" level at a time $t_3$.

The power-on-reset signal POR is supplied to each unit in the DRAM such as $\overline{RAS}$ input circuit 10 and test mode controller 14 as shown in FIG. 7. Therefore, during the reset period, signals in respective units in the DRAM shown in FIG. 9 maintain the respective initial states. Especially when focusing on the test mode, the test enable signal $\overline{TE}$ is maintained at an "H" level during a reset period as shown in FIG. 9 (i), and the DRAM is prevented from entering the test mode during this period.

On the other hand, FIG. 10 shows operation in the state where the external row address strobe signal $\overline{RAS}$, the external column address strobe signal $\overline{CAS}$, and the external write enable signal $\overline{WE}$ rise simultaneously after power-on to the DRAM and after a lapse of the above-mentioned reset period. In the case of FIG. 10, the above-described three external control signals slowly rise from a certain time after the time $t_3$ to attain an "H" level. Accordingly, corresponding three internal control signals, that is, the internal row address strobe signal int$\overline{RAS}$, the internal column address strobe signal int$\overline{CAS}$, and the internal write enable signal int$\overline{WE}$ respectively rise to an "H" level rapidly at the timings when the corresponding external control signals attain respective threshold levels for recognizing as an "H" level.

The test enable signal $\overline{TE}$ is initialized to an "H" level during the reset period, thereby preventing the DRAM from entering the test mode during the reset period.

In the operation shown in FIG. 10, there is a case where the rises of the three internal control signals sometimes occur at the timings slightly different from one another as described above. For example, as shown in FIG. 10, there may be a case where the internal row address strobe signal int$\overline{RAS}$ rapidly rises at a time $t_4$, while the internal column address strobe signal int$\overline{CAS}$ and the internal write enable signal $\overline{WE}$ rise rapidly at a time $t_5$ with a little delay. In such a case, between the times $t_4$ and $t_5$, the internal row address strobe signal int$\overline{RAS}$ accidentally attains an "H" level, and the internal column address strobe signal int$\overline{CAS}$ and the internal write enable signal int$\overline{WE}$ accidentally attain an "L" level. Test mode controller 14 results in erroneous recognition that the precondition for setting of the test mode by the above-described JEDEC standard are satisfied.

Therefore, in such a case, if the internal row address strobe signal int$\overline{RAS}$ temporarily falls from an "H" level to an "L" level (a portion shown by a broken line of FIG. 10 (d) and FIG. 11)) by variation caused by a noise or the like in the vicinity of a threshold value of, for example, the external row address strobe signal $\overline{RAS}$, test mode controller 14 erroneously generates the test enable signal $\overline{TE}$ designating the test mode accordingly (a portion shown by a broken line of FIG. 10 (i)). As a result, contrary to the user's intention, the DRAM unnecessarily enters the test mode right after power-on, causing malfunction of the DRAM.

SUMMARY OF THE INVENTION

One object of the present invention is to provide a semiconductor memory device which is prevented from erroneous setting of a test mode caused by a noise or the like.

Another object of the present invention is to provide a method of setting a test mode of a semiconductor memory device which eliminates a possibility of malfunction caused by a noise or the like.

Still another object of the present invention is to provide a semiconductor memory device which is prevented from erroneously entering a test mode after power-on in spite of the fact that the test mode is not instructed by an external control signal, and a method of setting the test mode.

In brief, the present invention relates to a semiconductor memory device including a memory cell array, internal circuits, a test mode controller, and power-on-reset circuits. The internal circuits carry out reading of data from the memory cell array and writing of data in the memory cell array in response to a plurality of control signals. The test mode controller sets a test mode of the memory cell array in response to a predetermined pattern of change of logic levels of at least several control signals out of the plurality of control signals. The power-on-reset circuits generate a reset pulse which sets at least the test mode controller in the initial state over a variable period which is defined based on a timing of change of a logic level of a control signal determining a timing of setting of the test mode out of the at least several control signals in response to power-on.

According to another aspect of the present invention, a semiconductor memory device includes a memory cell array, input circuits, internal circuits, a test mode controller, a first power-on-reset circuit, a second power-on-reset circuit, and a third power-on-reset circuit. The input circuits generate a plurality of internal control signals in response to a plurality of external control signals. The internal circuits carry out reading of data from the memory cell array and writing of data in the memory cell array in response to the plurality of internal control signals. The test mode controller sets a test mode of the memory cell array in response to a predetermined pattern of change of at least several logic levels out of the plurality of internal control signals. The first power-on-reset circuit generates a first pulse having a constant duration in response to power-on. The second power-on-reset circuit generates a second pulse having a variable duration which is defined based on the timing of change of a logic level of an internal control signal determining the timing of setting of the test mode out of the at least several internal control signals or an external control signal corresponding thereto. The third power-on-reset circuit generates a reset pulse corresponding to a logical OR of the first and the second pulses to set at least the test mode controller in the initial state during a duration of the reset pulse.

According to still another aspect of the present invention, a method of setting a test mode of a semiconductor memory device includes the steps of: supplying the semiconductor memory device with a plurality of external control signals for controlling operation of the semiconductor memory device; powering the semiconductor memory device on; generating a first reset pulse having a constant duration in response to power-on; converting the plurality of external control signals into a plurality of internal control signals to supply internal circuits of the semiconductor memory device with the same in response to power-on; setting the test mode of the semiconductor memory device upon detection of a predetermined pattern of change of at least several logic levels out of the plurality of internal control signals; generating a second pulse having a variable duration which is defined based on the timing of change of a logic level of an internal control signal determining the timing of setting of the test mode out of the at least several internal control signals or an external control signal corresponding thereto in response to power-on; and generating a reset pulse corresponding to a logical OR of the first and the second pulses to prevent setting of the test mode during a duration of the reset pulse.

Therefore, the main advantage of the present invention is that the semiconductor memory device is prevented from erroneously entering the test mode after power-on, by making the reset period of the test mode controller variable based on the timing of change of a logic level of a control signal determining the timing of setting of the test mode.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
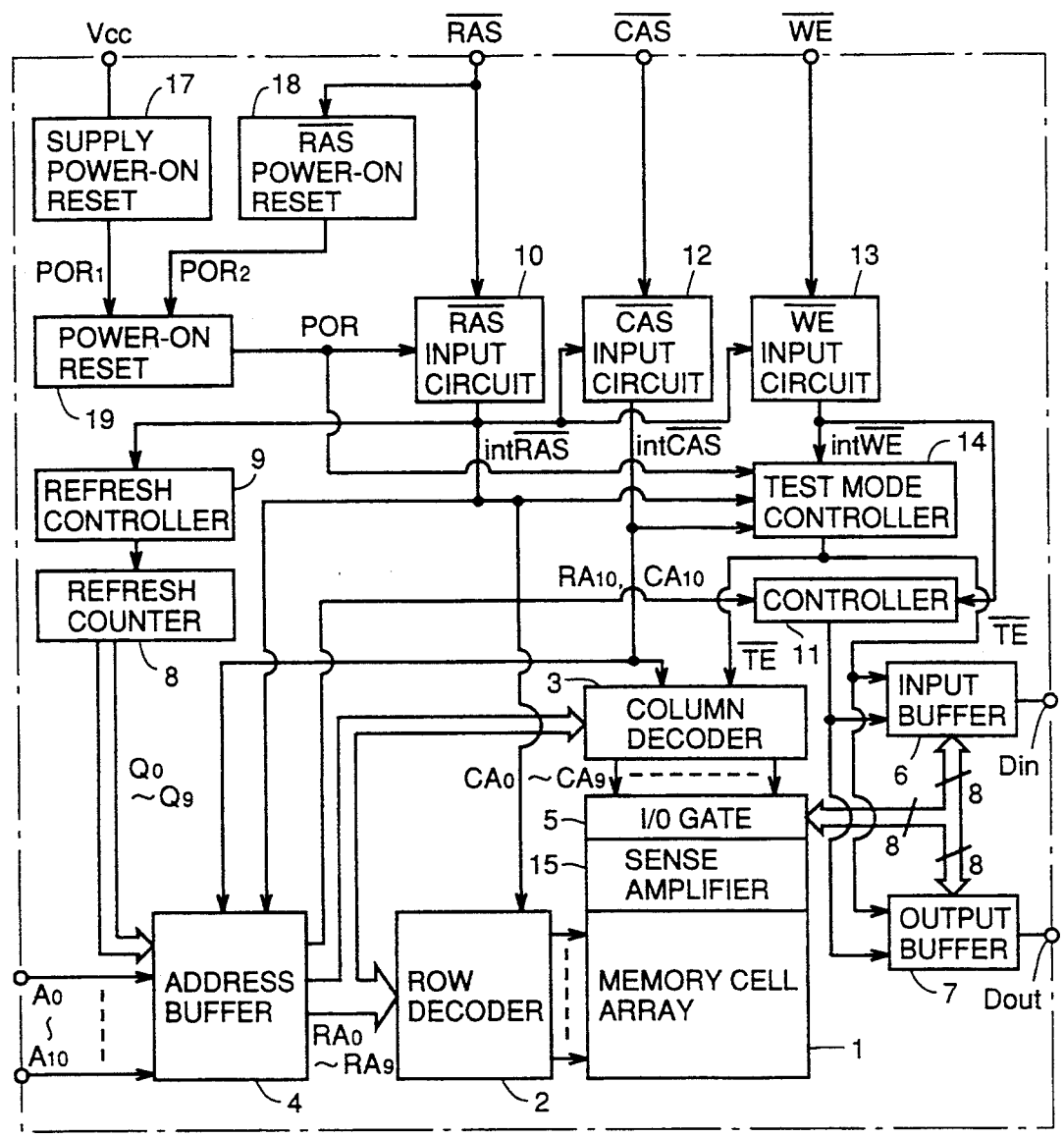
FIG. 1 is a block diagram showing a DRAM according to one embodiment of the present invention.

FIG. 1 is a block diagram showing the entire configuration of the DRAM according to one embodiment of the present invention. Referring to FIG. 1, not similar to the conventional DRAM shown in FIG. 7, this DRAM includes: a supply power-on-reset circuit 17 receiving a power supply voltage $V_{CC}$ supplied from an external power source (not shown) and responsive to the rise of the power supply voltage $V_{CC}$, that is, power-on to the DRAM, for generating a first power-on-reset signal POR1 which takes an "H" level during a predetermined period; a $\overline{RAS}$ power-on-reset circuit 18 receiving an external row address strobe signal $\overline{RAS}$ and responsive to change of a level of the received signal, for generating a second power-on-reset signal POR2 which takes an "H" level during a variable period; and a power-on-reset signal circuit 19 receiving the first and the second power-on-reset signals POR1 and POR2 for generating a power-on-reset signal for forcibly maintaining predetermined circuit units in the DRAM in a reset state.

Figure 2:
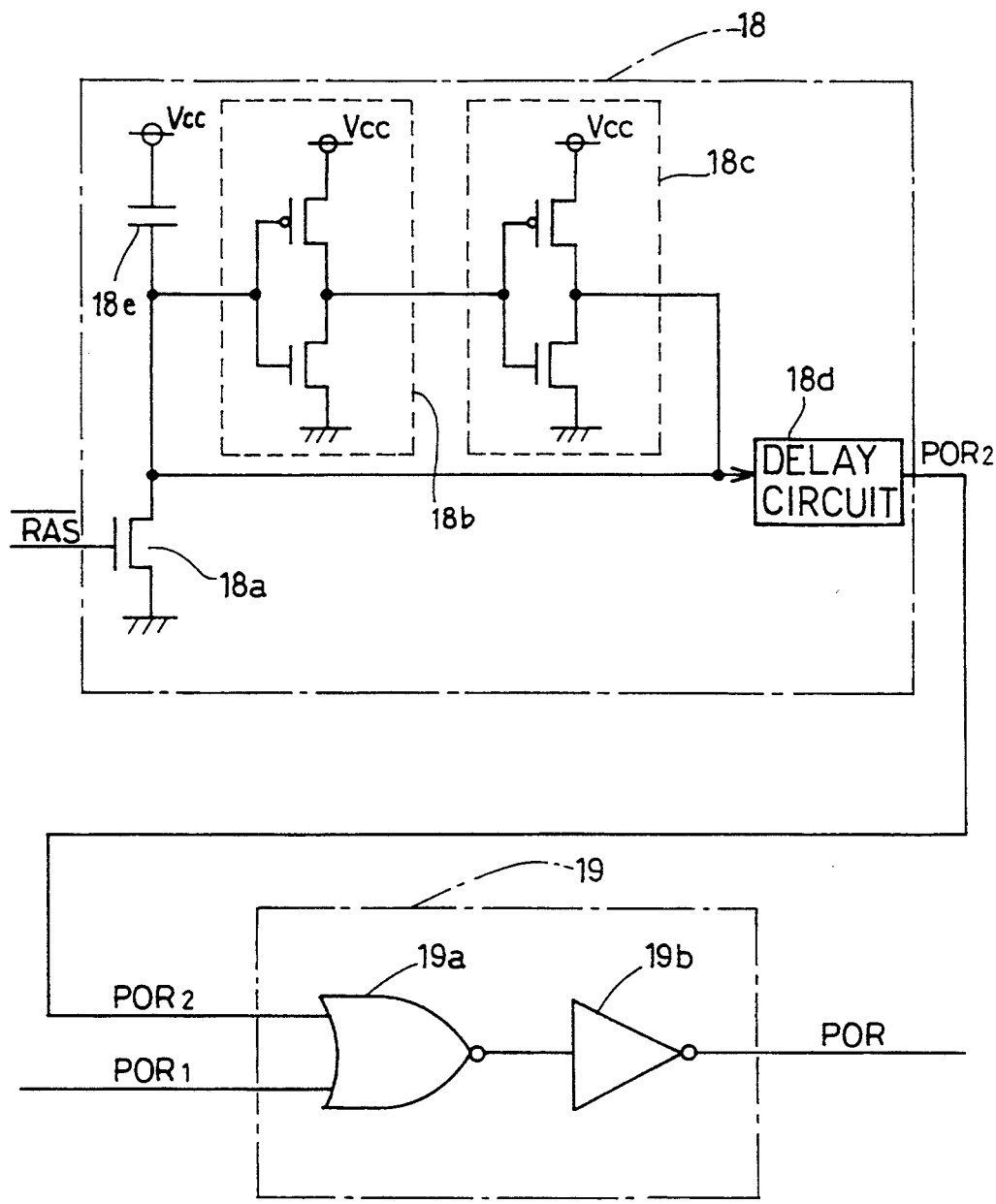
FIG. 2 is a circuit diagram showing in detail $\overline{RAS}$ power-on-reset circuit 18 and power-on-reset circuit 19 shown in FIG. 1.
Figure 3:
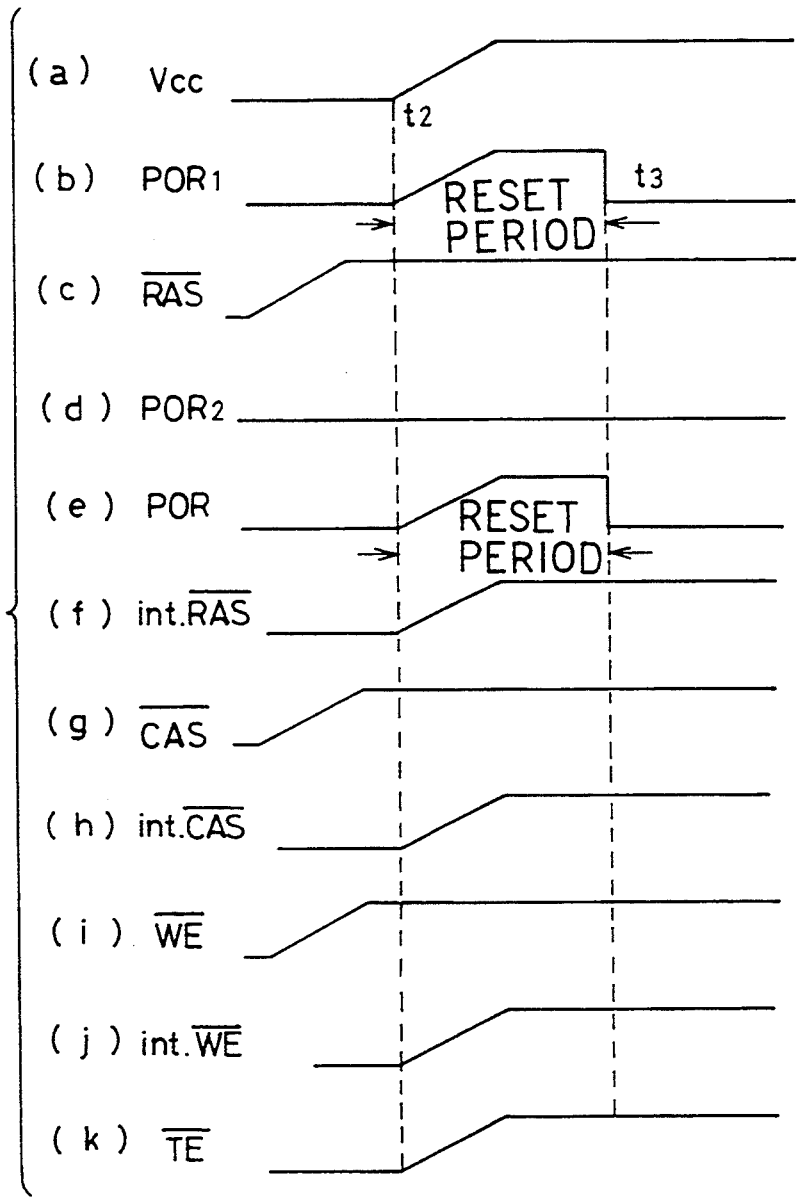
FIG. 3 is a timing chart for explaining operation of the embodiment shown in FIG. 1.
Figure 4:
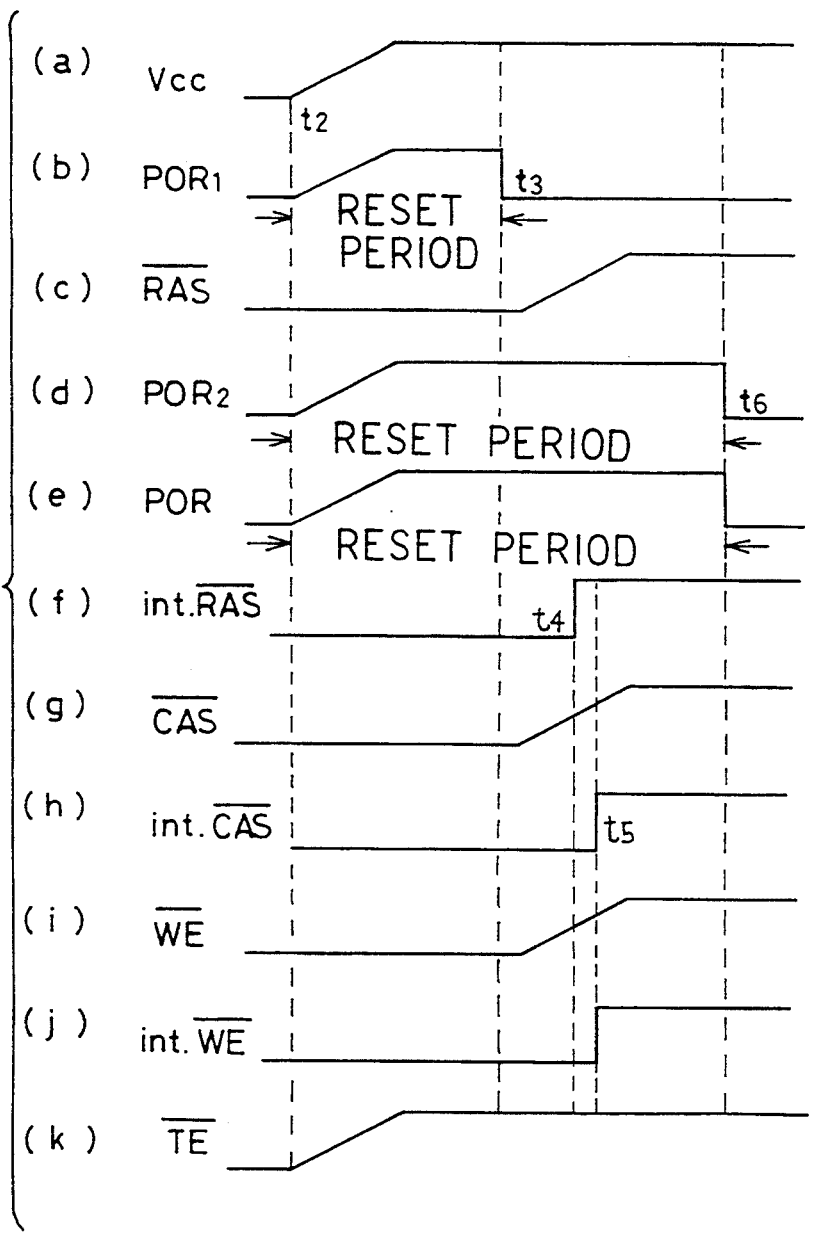
FIG. 4 is a timing chart for explaining operations of the embodiment shown in FIG. 1.
Figure 7:
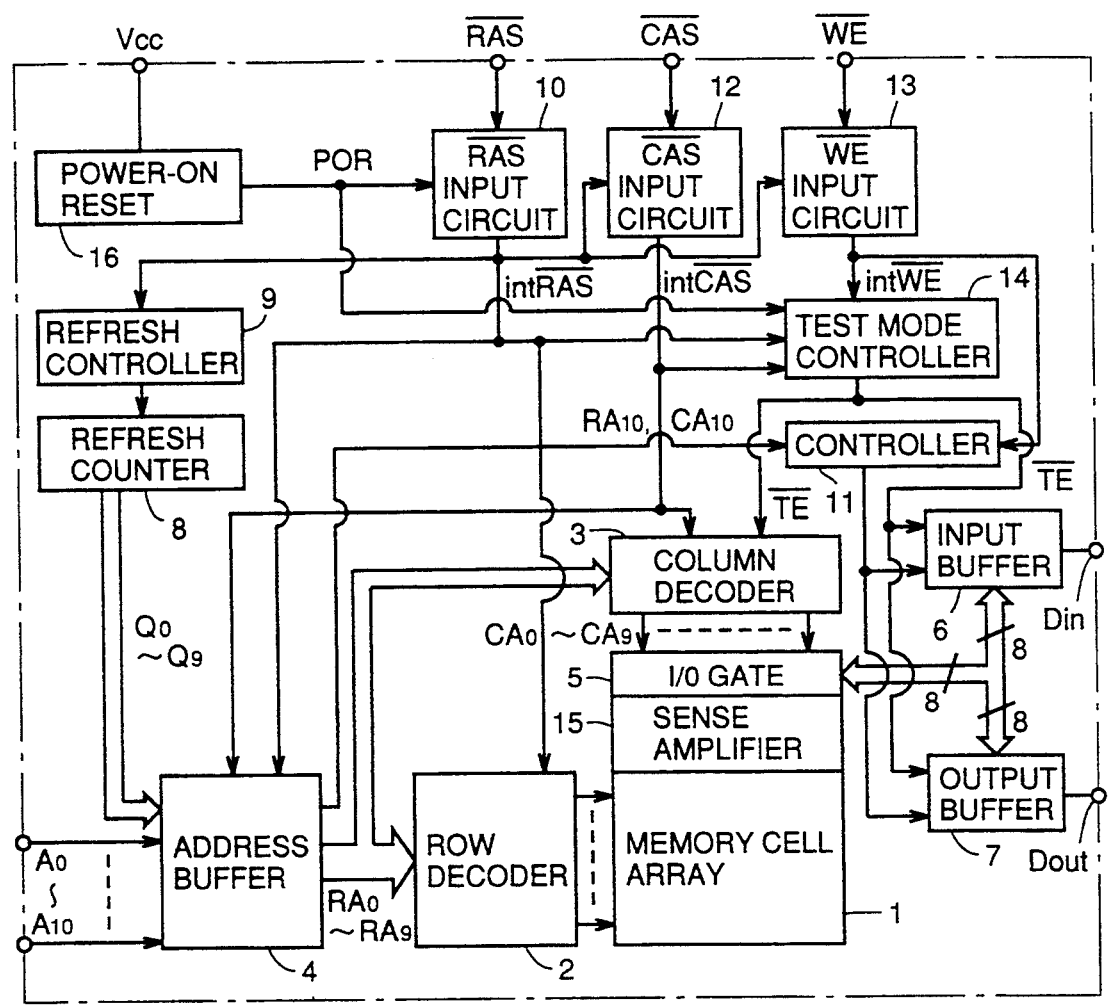
FIG. 7 is a block diagram showing one example of a conventional DRAM.
Figure 8:
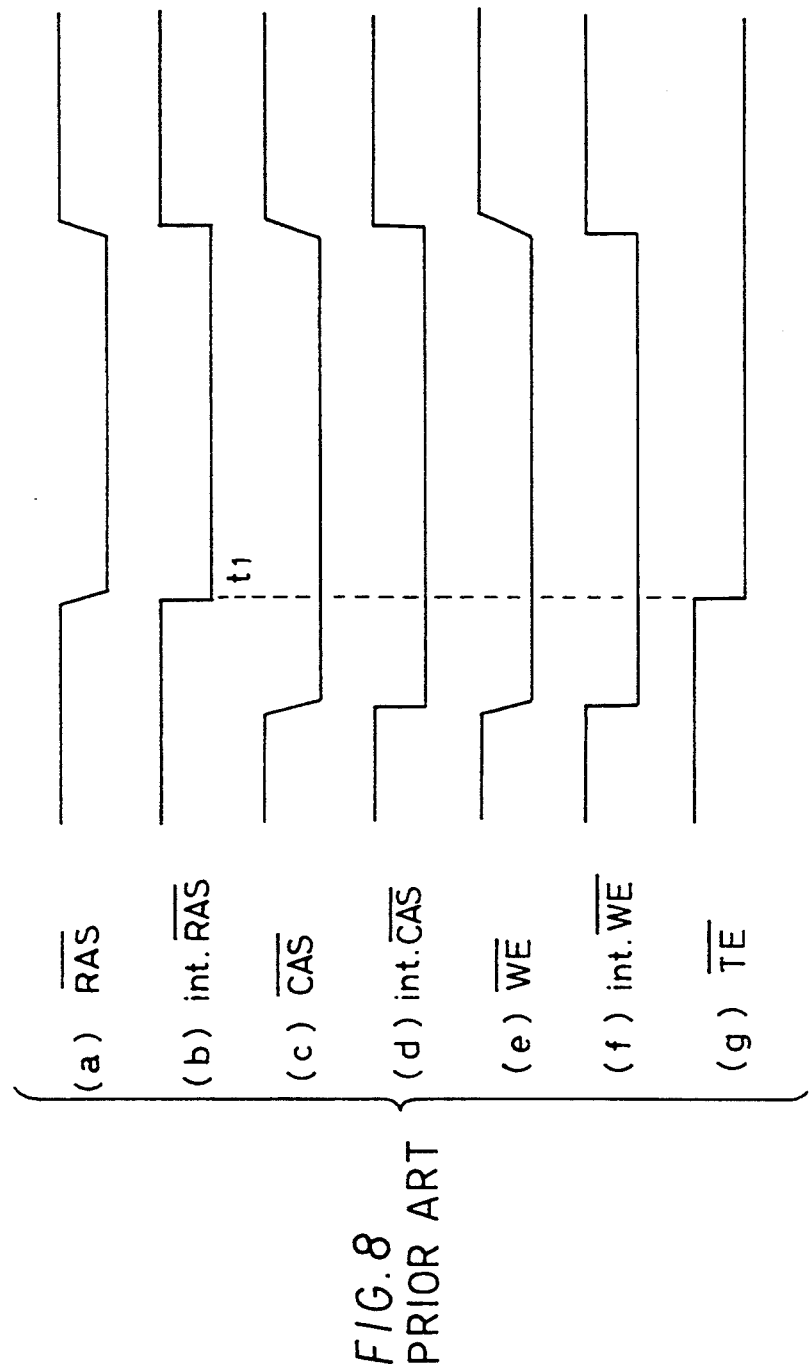
FIG. 8 is a timing chart showing operation of the DRAM shown in FIG. 7.

Since supply power-on-reset circuit 17 of FIG. 1 is identical to power-on-reset circuit 16 in the conventional DRAM of FIG. 7, the detailed description will not be repeated. Referring to FIGS. 2 to 4, description will now be given on $\overline{RAS}$ power-on-reset circuit 18 and power-on-reset circuit 19 in detail.

The external row address strobe signal $\overline{RAS}$ is first applied to $\overline{RAS}$ power-on-reset circuit 18. This signal is supplied to the gate of an N channel transistor 18a connected between the ground potential, and the input of a delay circuit 18d and the power supply potential $V_{CC}$. Serially connected two-stage inverters 18b and 18c are connected in parallel between transistor 18a and delay circuit 18d. The output of delay circuit 18d is provided from $\overline{RAS}$ power-on-reset circuit 18 as second power-on-reset signal POR2 to be applied to power-on-reset circuit 19.

Power-on-reset circuit 19 is constituted of an NOR gate 19a and an inverter 19b which are connected in series. First power-on-reset signal POR1 is applied to one input of NOR gate 19a from supply power-on-reset circuit 17 of FIG. 1. On the other hand, the above-described second power-on-reset signal POR2 is applied to the other input of NOR gate 19a. After being inverted by inverter 19b, the output of NOR gate 19a is provided from power-on-reset circuit 19 as a power-on-reset signal POR.

Figure 9:
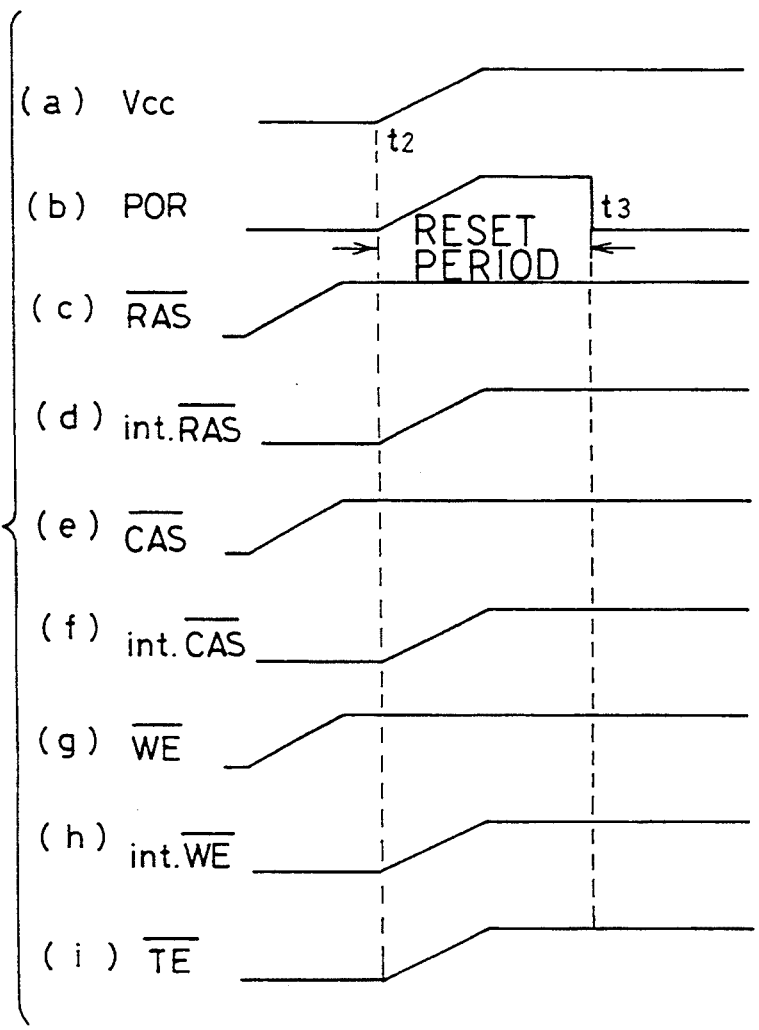
FIG. 9 is a timing chart showing operation of the DRAM shown in FIG. 7.

Referring to FIGS. 3 and 4, operation of the embodiment of FIG. 1 will be described. Similar to the conventional example of FIG. 9, FIG. 3 shows operation in the state where the external row address strobe signal $\overline{RAS}$ (c), the external column address strobe signal $\overline{CAS}$ (g), and the external write enable signal $\overline{WE}$ (i) all are already at an "H" level at the time of power-on to the DRAM.

In the case of FIG. 3, as the power supply voltage $V_{CC}$ (a) rises after power-on at the time $t_2$, the first power-on-reset signal POR1 (b), the internal row address strobe signal int$\overline{RAS}$ (f), the internal column address strobe signal int$\overline{CAS}$ (h), the internal write enable signal int$\overline{WE}$ (j), and the test enable signal $\overline{TE}$ (k) rise to an "H" level simultaneously to reach the respective initial states. As described above, the power-on-reset signal POR1 has maintained an "H" level during a predetermined reset period since its rise, and falls to an "L" level at the time $t_3$.

On the other hand, since the external row address strobe signal $\overline{RAS}$ is at an "H" level at the time of power-on (time $t_2$) in $\overline{RAS}$ power-on-reset circuit 18, N channel transistor 18a is turned on, and the input to delay circuit 18d is retained at an "L" level. Therefore, the second power-on-reset signal POR2 which is the output of $\overline{RAS}$ power-on-reset circuit 18 retains an "L" level (FIG. 3 (d)).

Upon reception of first and second power-on-reset signals POR1 and POR2 having the above-described waveforms, power-on reset circuit 19 provides a power-on-reset signal POR corresponding to their logical OR (FIG. 3 (e)) to supply the same to respective units in the DRAM including test mode controller 14. More specifically, the power-on-reset signal POR maintains an "H" level until the first and the second power-on-reset signals POR1 and POR both attain an "L" level. During this period, test mode controller 14 is forcibly reset to prevent setting of the test mode. In the case of FIG. 3, the reset period is substantially determined by a reset period of the first power-on-reset signal POR1.

Figure 10:
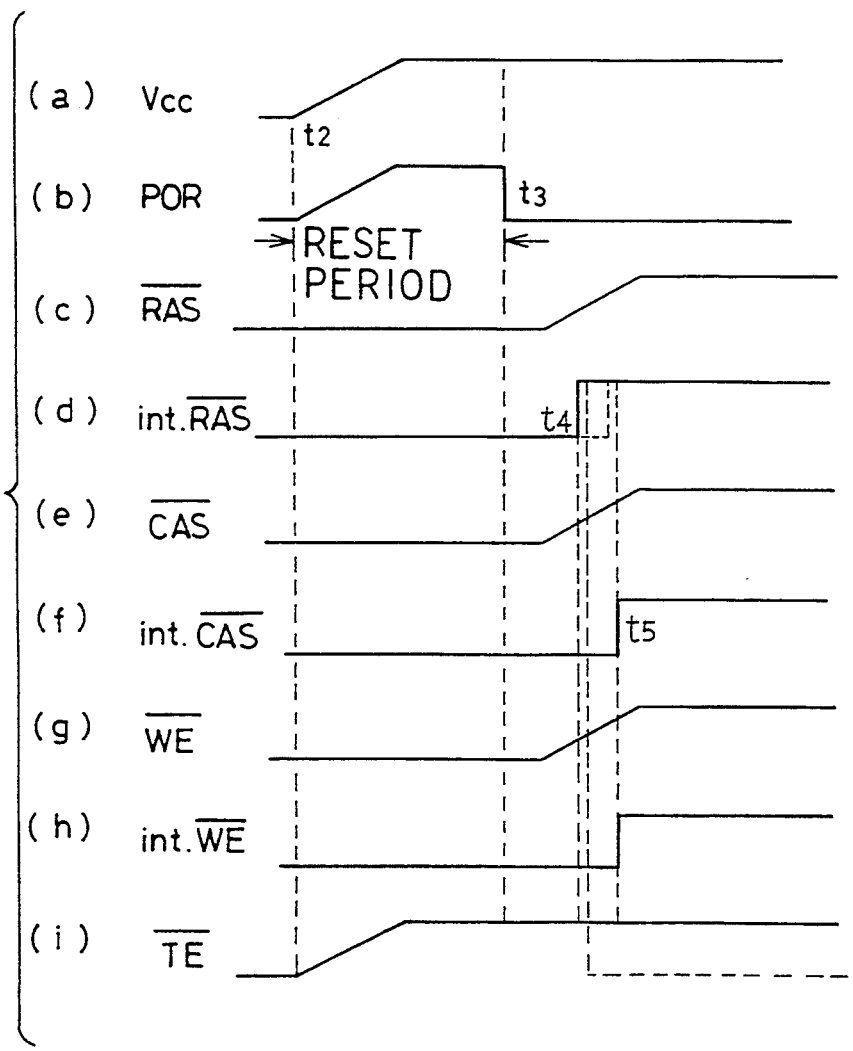
FIG. 10 is a timing chart showing operation of the DRAM shown in FIG. 7.
Figure 11:
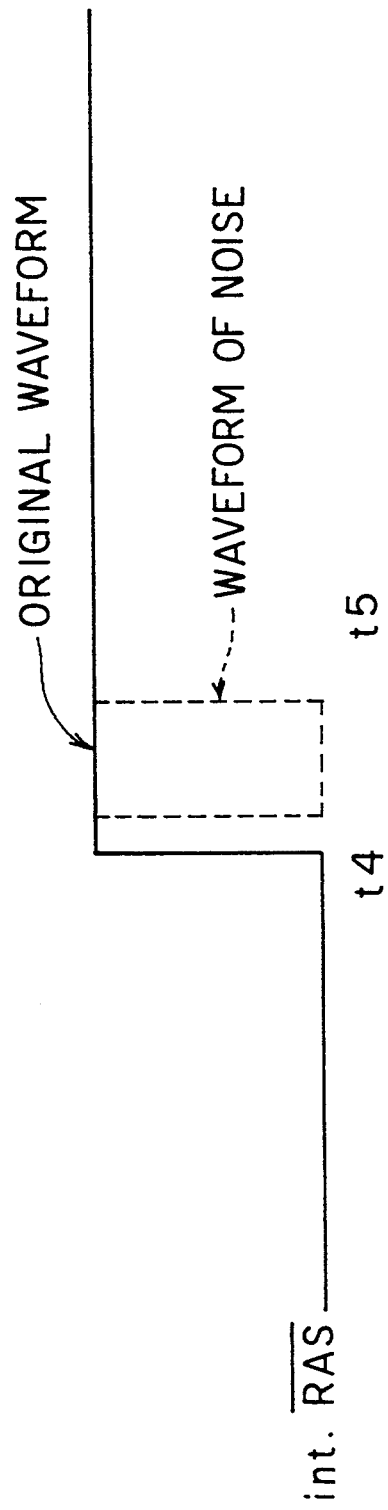
FIG. 11 is an enlarged view of a main portion of a waveform of the internal row address strobe signal in the timing chart of FIG. 10.

On the other hand, similar to the conventional example of FIG. 10, FIG. 4 shows operation in the state where the external row address strobe signal $\overline{RAS}$, the external column address strobe signal $\overline{CAS}$, and the external write enable signal $\overline{WE}$ simultaneously rise after power-on to the DRAM. In the case of FIG. 4, the three external control signals slowly rise from a certain time after the time $t_3$ to attain an "H" level. Accordingly, corresponding three internal control signals, that is, the internal row address strobe sinal int$\overline{RAS}$, the internal column address strobe signal int$\overline{CAS}$, and the internal write enable signal int$\overline{WE}$ also rise to an "H" level, respectively.

Since the external row address strobe signal $\overline{RAS}$ is at an "L" level at the time of power-on (time $t_3$) in $\overline{RAS}$ power-on-reset circuit 18, N channel transistor 18a is turned off. In this case, floating of the input of delay circuit 18d at the time of power-on is avoided because of the power supply potential $V_{CC}$ and a capacitor 18, and it is possible to bring the second power-on-reset signal POR2 into an "H" level after power-on (FIG. 4 (d)).

When the external row address strobe signal $\overline{RAS}$ rises from an "L" level to an "H level, N channel transistor 18a is turned on. The second power-on-reset signal POR2 falls from an "H" level to an "L" level with a predetermined delay time caused by delay circuit 18d (time $t_6$). Even if the external row address strobe signal $\overline{RAS}$ falls to an "L" level, afterwards, N channel transistor 18a is turned off, resulting in maintenance of an "L" level of the second power-on-reset signal POR2.

Upon reception of the first and the second power-on-reset signals POR1 and POR2 having the above-described waveforms, power-on-reset circuit 19 provides a power-on-reset signal POR corresponding to their logical OR (FIG. 4 (e)) to supply the same to respective units in the DRAM including test mode controller 14. More specifically, in the case of FIG. 4, the reset period of the power-on-reset POR is substantially determined by the second power-on-reset signal POR2. During this reset period, test mode controller 14 is forcibly reset to prevent setting of the test mode.

Therefore, in the case of FIG. 4, even if the three internal control signals accidentally satisfy the test mode setting conditions of JEDEC between the times $t_4$ and $t_5$, similar to the conventional example of FIG. 10, the test mode will not be set because test mode controller 14 is reset by the power-on-reset signal POR.

As described above, according to the embodiment of the present invention, if the external row address strobe signal $\overline{RAS}$ is not at an "H" level at the time of power-on to the DRAM, test mode controller 14 is kept in the reset condition until the external row address strobe signal $\overline{RAS}$ completely attains an "H" level. As a result, this prevents malfunction of erroneous setting of the DRAM in the test mode when the external row address strobe signal $\overline{RAS}$ rises after power-on.

Figure 5:
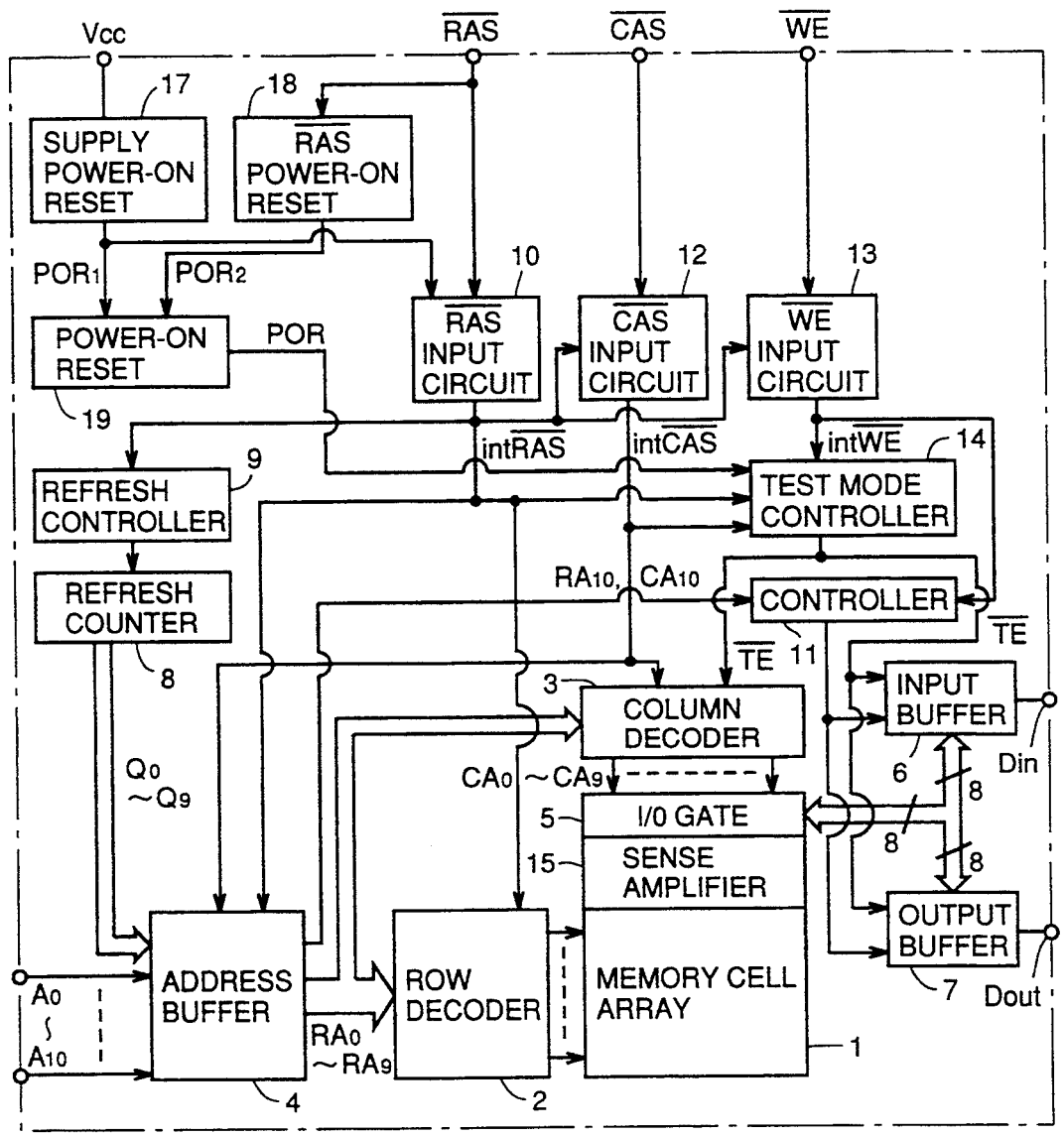
FIG. 5 is a block diagram showing a DRAM according to another embodiment of the present invention.

FIG. 5 is a block diagram showing the entire configuration of the DRAM according to another embodiment of the present invention. Since the embodiment shown in FIG. 5 is similar to the embodiment shown in FIG. 1 excluding the following points, description on the common portions will not be repeated.

More specifically, in the embodiment of FIG. 1, $\overline{RAS}$ input circuit 10 and test mode controller 14 are controlled by the power-on-reset signal POR provided from power-on-reset circuit 19. However, as shown in FIG. 5, $\overline{RAS}$ input circuit 10 and test mode controller 14 may be controlled by the first power-on-reset signal POR1 provided from supply power-on-reset circuit 17 and the power-on-reset signal POR provided from power-on-reset circuit 19, respectively.

Figure 6:
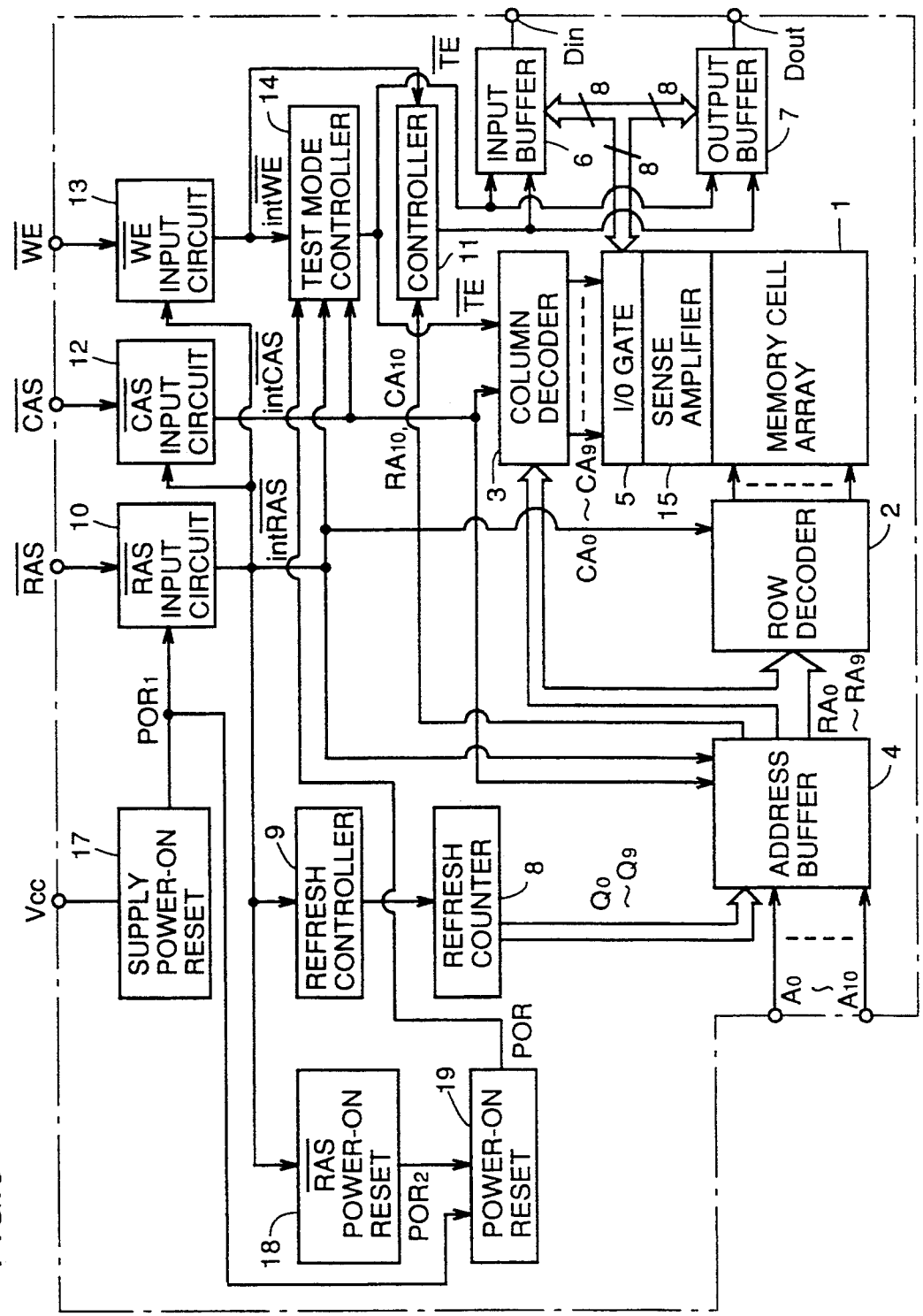
FIG. 6 is a block diagram showing a DRAM according to still another embodiment of the present invention.

FIG. 6 is a block diagram showing the entire configuration of the DRAM according to a still another embodiment of the present invention. Since the embodiment shown in FIG. 6 is similar to the embodiment shown in FIG. 5 excluding the following points, description on the common portions will not be repeated.

More specifically, in the embodiment shown in FIG. 5, $\overline{RAS}$ power-on-reset circuit 18 generates the second power-on-reset signal POR2 in response to the external row address strobe signal $\overline{RAS}$. However, as shown in FIG. $\overline{RAS}$ power-on-reset circuit 18 may receive the internal row address strobe signal int$\overline{RAS}$ provided from $\overline{RAS}$ input circuit 10 and generate the second power-on-reset signal POR2. In this case, operations are basically identical those shown in timing charts of FIGS. 3 and 4.

In the above-described embodiments, in order to set the DRAM in the test mode, when the internal control signals $\overline{CAS}$ and $\overline{WE}$ both are at an "L" level, the internal control signal $\overline{RAS}$ is caused to fall to an "L" level according to the international standard determined by JEDEC as described above. However, the present invention is not limited to such a standard, but may be applied to any other standards, such as a standard in which a test mode is carried out upon detection of change of the internal control signal $\overline{CAS}$.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a memory cell array;
   internal circuit means responsive to a plurality of control signals for carrying out reading of data from said memory cell array and writing of data in said memory cell array;
   means responsive to a predetermined pattern of change of logic levels of at least several control signals out of said plurality of control signals for setting a test mode of said memory cell array; and
   reset pulse generating means responsive to power-on for generating a reset pulse setting at least said means for setting a test mode in an initial state over a variable period, said variable period defined by the timing of a change in logic level of one of said plurality of control signals.

2. The semiconductor memory device as recited in claim 1, wherein
   said reset pulse generating means includes means for defining said variable period so that said variable period always includes a period during which the predetermined pattern of change of logic levels of said several control signals required for setting of said test mode may take place.

3. A semiconductor memory device, comprising:
   a memory cell array;
   means responsive to a plurality of external control signals for generating a plurality of internal control signals;
   internal circuit means responsive to said plurality of internal control signals for carrying out reading of data from said memory cell array and writing of data in said memory cell array;
   means responsive to a predetermined pattern of change of logic levels of at least several internal control signals out of said plurality of internal control signals for setting a test mode of said memory cell array;
   first pulse generating means responsive to power-on for generating a first pulse having a constant duration;
   second pulse generating means responsive to power-on for generating a second pulse having a variable duration said variable duration defined by the timing of a change in logic level of an internal control signal of said at least several internal control signals or an external control signal corresponding thereto; and
   reset pulse generating means for generating a reset pulse corresponding to a logical OR of said first and second pulses to set at least said means for setting a test mode in an initial state during a duration of said reset pulse.

4. The semiconductor memory device as recited in claim 3, wherein
   said second pulse generating means includes means for defining said variable duration of the second pulse so that said variable duration always includes a period during which the predetermined pattern of change of logic levels of said several internal control signals required for setting of said test mode may take place, when such a predetermined pattern of change may not take place within said constant duration of the first pulse.

5. A semiconductor memory device, comprising:
   a memory cell array;
   input circuit means responsive to an external row address strobe signal, an external column address strobe signal, and an external write enable signal for generating an internal row address strobe signal, an internal column address strobe signal, and an internal write enable signal;
   internal circuit means responsive to said internal row address strobe signal, said internal column address strobe signal, and said internal write enable signal for carrying out reading of data from said memory cell array and writing of data in said memory cell array;
   a test mode controller responsive to a predetermined pattern of change of logic levels of said internal row address strobe signal, said internal column address strobe signal, and said internal write enable signal for setting a test mode of said memory cell array;
   a first power-on-reset circuit responsive to power-on for generating a first pulse having a constant duration;
   a second power-on-reset circuit responsive to power-on for generating a second pulse having a variable duration which is defined based on a timing of change of a logic level of said external row address strobe signal; and
   a third power-on-reset circuit for generating a reset pulse corresponding to a logical OR of said first and second pulses to set at least said test mode controller in an initial state during a duration of said reset pulse.

6. A semiconductor memory device, comprising:
   a memory cell array;
   input circuit means responsive to an external row address strobe signal, an external column address strobe signal, and an external write enable signal for generating an internal row address strobe signal, an internal column address strobe signal, and an internal write enable signal;
   internal circuit means responsive to said internal row address strobe signal, said internal column address strobe signal, and said internal write enable signal for carrying out reading of data from said memory cell array and writing of data in said memory cell array;
   a test mode controller responsive to a predetermined pattern of change of logic levels of said internal row address strobe signal, said internal column address strobe signal, and said internal write enable signal for setting a test mode of said memory cell array;
   a first power-on-reset circuit responsive to power-on for generating a first pulse having a constant duration;
   a second power-on-reset circuit responsive to power-on for generating a second pulse having a variable duration which is defined based on a timing of change of a logic level of said internal row address strobe signal; and
   a third power-on-reset circuit for generating a reset pulse corresponding to a logical OR of said first and second pulses to set at least said test mode controller in an initial state during a duration of said reset pulse.

7. A method of setting a test mode of a semiconductor memory device, comprising the steps of:

supplying said semiconductor memory device with a plurality of external control signals for controlling an operation of said semiconductor memory device;

powering said semiconductor memory device on;

generating a first reset pulse having a constant duration in response to said power-on;

converting said plurality of external control signals into a plurality of internal control signals to supply internal circuits of said semiconductor memory device with the same in response to said power-on;

setting a test mode of said semiconductor memory device upon detection of a predetermined pattern of change of logic levels of at least several internal control signals out of said plurality of internal control signals;

generating a second pulse having a variable duration which is defined based on a timing of change of a logic level of an internal control signal determining a timing of setting of said test mode out of said at least several internal control signals or an external control signal corresponding thereto, in response to said power-on; and generating a reset pulse corresponding to a logical OR of said first and second pulses to prevent setting of a test mode during a duration of said reset pulse.

* * * * *